US007175967B1

(12) United States Patent
Mulligan et al.

(10) Patent No.: US 7,175,967 B1
(45) Date of Patent: Feb. 13, 2007

(54) HEAT TREATMENT OF MULTILAYER IMAGEABLE ELEMENTS

(75) Inventors: James L. Mulligan, Fort Collins, CO (US); Eric Clark, Loveland, CO (US); Kevin B. Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/366,076

(22) Filed: Mar. 2, 2006

(51) Int. Cl.

| | |
|---|---|
| ***G03F 7/038*** | (2006.01) |
| ***G03F 7/039*** | (2006.01) |
| ***G03F 7/095*** | (2006.01) |
| ***G03F 7/11*** | (2006.01) |
| ***G03F 7/38*** | (2006.01) |

(52) U.S. Cl. .................... 430/271.1; 430/15; 430/302; 430/326; 430/327; 430/330; 430/349; 430/905; 430/910; 430/926; 430/935; 430/964

(58) Field of Classification Search ................. 430/15, 430/271.1, 302, 326, 327, 330, 349, 905, 430/910, 935, 926, 964
See application file for complete search history.

(56) References Cited

U.S. PATENT DOCUMENTS

| | | | | |
|---|---|---|---|---|
| 6,143,464 | A | 11/2000 | Kawauchi | |
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,461,795 | B1 * | 10/2002 | McCullough et al. | 430/302 |
| 6,528,228 | B2 | 3/2003 | Hauck et al. | |
| 6,593,055 | B2 | 7/2003 | Shimazu et al. | |
| 6,706,466 | B1 | 3/2004 | Lott et al. | |
| 7,066,731 | B2 * | 6/2006 | Tenaglia et al. | 432/226 |
| 7,087,362 | B2 * | 8/2006 | Shimada et al. | 430/281.1 |
| 2002/0110760 | A1 * | 8/2002 | Lin | 430/322 |
| 2003/0157434 | A1 * | 8/2003 | Oda et al. | 430/273.1 |
| 2004/0067432 | A1 | 4/2004 | Kitson et al. | |

FOREIGN PATENT DOCUMENTS

| | | |
|---|---|---|
| EP | 1023994 | 4/2004 |
| JP | 2000-330265 | 11/2000 |
| WO | WO99/21715 | 5/1999 |

* cited by examiner

*Primary Examiner*—Richard L. Schilling
(74) *Attorney, Agent, or Firm*—J. Lanny Tucker

(57) ABSTRACT

Positive-working imageable elements are prepared by providing a first layer and second layers onto a substrate. Both layers include the same or different radiation absorbing compounds dispersed within different polymeric binders. After both layers are dried, they are heat treated at from about 40 to about 90° C. for at least 4 hours under conditions that inhibit the removal of moisture from the dried first and second layers. This method of preparation provides elements with improved imaging speed and good shelf life.

23 Claims, No Drawings

HEAT TREATMENT OF MULTILAYER IMAGEABLE ELEMENTS

FIELD OF THE INVENTION

This invention relates to a method of making positive-working imageable elements that have improved imaging speed and shelf life. It also relates to methods of using these elements to obtain lithographic printing plates and images therefrom.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. Patent Application Publication 2004/0067432 A1 (Kitson et al.).

WO 99/21715 (McCullough et al.) describes a heat treatment of positive-working imageable multilayer elements at moderate temperatures during manufacture to reduce variability in sensitivity over time. This process is improved by the heat treatment method described in U.S. Pat. No. 6,706,466B1 (Lott et al.) in which stacks of imageable elements are heat treated while wrapped tightly or under controlled humidity so moisture is not removed from the elements during the treatment.

Problem to be Solved

While resistance to chemical solvents used in lithographic processing and printing has been improved over the years with various compositional changes, it has been difficult to achieve this result with "single-layer" imageable elements. Thus, multilayer elements have been designed to overcome these problems. Radiation-absorbing compounds such as IR dyes have been placed in multiple layers of such elements to increase imaging speed but this has reduced the shelf life of the elements.

Thus, there is a need for a way to achieve high imaging speed and good shelf life of multilayer imageable elements while maintaining high resistance to chemical solvents.

SUMMARY OF THE INVENTION

This invention provides a method of providing a positive working imageable element comprising:

A) providing a first layer onto a substrate, the first layer comprising a first radiation absorbing compound dispersed within a first polymeric binder, B) providing a second layer on the first layer, the second layer comprising a second radiation absorbing compound dispersed within a second polymeric binder, and C) after drying the first and second layers, heat treating the first and second layers at from about 40 to about 90° C. for at least 4 hours under conditions that inhibit the removal of moisture from the dried first and second layers.

The method of this invention can further comprise:

D) imagewise exposing the imageable element to provide imaged and non-imaged regions, and E) contacting the imagewise exposed imageable element with an aqueous developer to remove the imaged regions only.

The method of this invention provides multilayer imageable elements that have improved shelf life and imaging speed while maintaining desired chemical resistance. This is achieved by heat treating the imageable elements after all layers have been applied to a substrate and dried. In addition, multiple layers of the elements include the same or different-radiation absorbing compounds and in preferred embodiments, specific polymeric binders are used that increase the chemical resistance.

DETAILED DESCRIPTION OF THE INVENTION

Definitions

Unless the context indicates otherwise, when used herein, the terms "imageable element" and "printing plate precursor" are meant to be references to embodiments obtained by the present invention.

In addition, unless the context indicates otherwise, the various components described herein such as the "first" and "second" polymeric binders, "coating solvent", first and second "radiation absorbing compounds", "phenolic resin", "alkaline developer", and similar terms also refer to mixtures of such components. Thus, the use of the article "a" or "an" is not necessarily meant to refer to only a single component.

Unless otherwise indicated, percentages refer to percentages by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Unless otherwise indicated, the term "polymer" or "polymeric binder" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements obtained by using this invention can be used in a number of ways. The preferred use is as precursors to lithographic printing plates as described in more detail below. However, this is not meant to be the only use of the imageable elements. For example, they can also be used in photomask lithography and imprint lithography, and to make chemically amplified resists, printed circuit boards, and microelectronic and microoptical devices.

Imageable Element

In general, the imageable elements obtained by this invention comprise a substrate, a first layer (also sometimes known as an "underlayer" or "inner layer"), and a second layer (also sometimes known as a "top layer" or "outer" layer) disposed over the first layer. Before thermal imaging, the second layer is not removable by an alkaline developer, but after thermal imaging, the imaged regions of the second layer are removable by the alkaline developer. The first layer is also removable by the alkaline developer. A radiation absorbing compound, generally an infrared radiation absorbing compound (defined below), is present in both the first and second layers of the imageable element. A radiation absorbing compound can also optionally be in a separate layer between the first and second layers. The radiation absorbing compounds in the various layers can be the same or different compounds, and preferably, they are the same compounds.

The imageable elements are formed by suitable application of a first layer composition onto a suitable substrate. This substrate can be an untreated or uncoated support but it is usually treated or coated in various ways as described below prior to application of the first layer composition. The substrate generally has a hydrophilic surface or at least a surface that is more hydrophilic than overlying layers. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, sodium phosphate/sodium fluoride composition, poly(vinyl phosphonic acid) (PVPA), vinyl phosphonic acid copolymer, poly (acrylic acid), or acrylic acid copolymer. Preferably, the grained and anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 nm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

First Layer

The first layer is disposed between the second layer and the substrate and, typically, is disposed directly on the substrate described above. The first layer comprises a "first" radiation absorbing compound (defined below) that is dispersed within a "first" polymeric material.

Particularly useful first polymeric binders are addition polymers derived from one or more ethylenically unsaturated polymerizable monomers and thus comprise recurring units derived from one or more of such monomers, including but not limited to, (meth)acrylamides, (meth)acrylonitriles, N-substituted cyclic imides, styrenic derivatives, and monomers having a pendant urea group.

More particularly, the first polymeric binder comprises recurring units derived from one or more (meth)acrylamides, (meth)acrylonitriles, N-substituted cyclic imides, and monomers represented by the following Structure (I) or (II):

$$CH_2{=}CH(R^1){-}C(O){-}X{-}(Y)_m{-}R^2 \quad (I)$$

$$CH_2{=}CH(R^1){-}Ar{-}[(Y)_m{-}R^2]_p \quad (II)$$

wherein $R^1$ is hydrogen, a substituted or unsubstituted lower alkyl group having 1 to 6 carbon atoms (such as methyl, ethyl, and iso-propyl), or a halo group (such as fluoro or chloro), and X is oxy or —NR'—wherein R' is hydrogen, a substituted or unsubstituted alkyl group having 1 to 4 carbon atoms (such as methyl, ethyl, iso-propyl, methoxymethyl, and n-butyl). Preferably, $R^1$ is hydrogen or methyl, and X is oxy or —NH—.

Ar is a substituted or unsubstituted arylene group such as a substituted or unsubstituted phenylene or naphthylene group. Preferably, Ar is a substituted or unsubstituted phenylene group.

Y is a substituted or unsubstituted alkylene group having 1 to 10 carbon atoms, and preferably Y is a linear or branched alkylene group having 1 to 4 carbon atoms.

$R^2$ is a —NHC(O)NH-phenyl group or phenyl group wherein the phenyl ring can be unsubstituted or substituted with one or more carboxy, hydroxy, or $—S(O)_2NH_2$ groups. Preferably, the phenyl moiety in $R^2$ is substituted with a hydroxy or carboxy group. Moreover, m is 0 or 1, and p is 1 to 5. Preferably, m is 1 and p is 1. In Structure (I), m must be 1 when $R^2$ is a —NHC(O)NH-phenyl group.

Preferred embodiments of the first polymeric binder can be represented by the following Structure (III):

$$-(A)_w-(B)_x-(C)_y-(D)_z- \quad (III)$$

wherein A represents recurring units derived from one or more (meth)acrylamides, B represents recurring units derived from one or more (meth)acrylonitriles, C represents recurring units derived from one or more N-substituted maleimides, D represents recurring units derived from one or more monomers represented by Structure (I) or (II), w is from about 1 to about 30 wt. %, x is from about 20 to about 75 wt. %, y is from about 1 to about 30 wt. %, and z is from about 20 to about 75 wt. %.

Preferably, w is from about 1 to about 15 wt. %, x is from about 30 to about 60 wt. %, y is from about 1 to about 15 wt. %, and z is from about 20 to about 45 wt. %.

In other embodiments of the first polymeric binder, the D recurring units can be derived from two or more "D" monomers, such as a combination of first and second D monomers. In some combinations of these monomers, the first "D" monomer is defined by Structure (I) wherein $R^1$ is hydrogen or a methyl group, X is oxy, Y is a $—CH_2CH_2—$ group, m is 1, and $R^2$ is a —NHC(O)NH-phenyl, —NHC(O)NH—$C_6H_4$—OH, or —NHC(O)NH—$C_6H_4$—COOH group, and the second "D" monomer is also defined by Structure (I) wherein $R^1$ is hydrogen or a methyl group, X is —NH—, m is 0, and $R^2$ is a phenyl, hydroxyphenyl, or carboxyphenyl group.

For other combinations of first and second "D" monomers, the first "D" monomer is defined by Structure (II) wherein $R^1$ is hydrogen or a methyl group, Y is a $—C(CH_3)_2—$ group, m is 1, p is 1, and $R^2$ is a —NHC(O)NH-phenyl, —NHC(O)NH—$C_6H_4$—OH, or —NHC(O)NH—$C_6H_4$—COOH group, and the second "D" monomer is defined by Structure (I) wherein $R^1$ is hydrogen or a methyl group, X is —NH—, m is 0, and $R^2$ is a phenyl, hydroxyphenyl, or carboxyphenyl group.

The first polymeric binder is generally present in the first (inner) layer in an amount of at least 75 weight %, and preferably from about 75 to about 95 weight %, based on the total dry layer weight.

As noted above, the first layer also comprises a radiation absorbing compound (preferably an infrared radiation absorbing compound) that absorbs radiation at from about 600 to about 1200 nm and preferably at from about 700 to about 1200 nm, with minimal absorption at from about 300 to about 600 nm. This compound (sometimes known as a "photothermal conversion material") absorbs radiation and converts it to heat. This compound may be either a dye or pigment (such as ferrous pigments and carbon blacks). Examples of useful pigments are ProJet 900, ProJet 860 and ProJet 830 (all available from the Zeneca Corporation). The imageable elements containing radiation absorbing compounds may also be imaged with a hot body, such as a thermal head or an array of thermal heads.

Useful IR absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR dyes (especially those that are soluble in an alkaline developer) are preferred to prevent sludging of the developer by insoluble material. Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorbo® IR 165 (GPTGlendale Inc. Lakeland, Fla.), and IR Absorbing Dye A used in the Examples below.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The radiation absorbing compound can be present in the first layer in an amount of generally at least 0.5% and up to 10% and preferably from about 0.5 to about 5%, based on the total dry first layer weight. One skilled in the art can readily determine useful amounts of a given IR absorbing compound.

The first layer can also include other components such as surfactants, dispersing aids, humectants, biocides, viscosity builders, drying agents, defoamers, preservatives, antioxidants, colorants, and other polymers such as novolaks, resoles, or resins that have activated methylol and/or activated alkylated methylol groups.

The first layer generally has a dry coating coverage of from about 0.5 to about 2.5 $g/m^2$ and preferably from about 0.5 to about 1 $g/m^2$.

Second Layer

The second layer is disposed over the first layer and in preferred embodiments there are no intermediate layers between the first and second layers. In most preferred embodiments, the second layer is also the outermost layer in the element.

The second layer becomes soluble or dispersible in the developer following thermal exposure. It typically comprises one or more "second" polymeric binders that are ink-receptive polymeric materials, and one or more radiation absorbing compounds. Alternatively, or additionally, the second polymeric binder comprises polar groups and acts as both the binder and as a dissolution inhibitor.

The radiation absorbing compound can be the same or different as those incorporated into the first layer. These compounds are defined above. The radiation absorbing compound can be present in the second layer in an amount of generally at least 0.5% and up to 10% and preferably from about 0.5 to about 5%, based on the total dry second layer weight. Useful amounts needed for a given IR absorbing compound can be readily determined by one skilled in the art.

Any polymer binders may be employed as second polymeric binders in the imageable elements if they have been previously used in outer layers of prior art multi-layer thermally imageable elements. For example, the second polymeric binders can be one or more of those described in U.S. Pat. No. 6,358,669 (Savariar-Hauck), U.S. Pat. No. 6,555,291 (Hauck), U.S. Pat. No. 6,352,812 (Shimazu et al.), U.S. Pat. No. 6,352,811 (Patel et al.), U.S. Pat. No. 6,294,311 (Shimazu et al.), U.S. Pat. No. 6,893,783 (Kitson et al.), and U.S. Pat. No. 6,645,689 (Jarek), U.S. Patent Application Publications 2003/0108817 (Patel et al) and 2003/0162,126 (Kitson et al.), and WO 2005/018934 (Kitson et al.).

Preferably, the second polymeric binder in the outer layer is a light-insensitive, water-insoluble, aqueous alkaline developer-soluble, film-forming phenolic resin that has a multiplicity of phenolic hydroxyl groups. Phenolic resins have a multiplicity of phenolic hydroxyl groups, either on the polymer backbone or on pendent groups. Novolak resins, resol resins, acrylic resins that contain pendent phenol groups, and polyvinyl phenol resins are preferred phenolic resins. Novolak resins are more preferred.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolak resins are prepared by reacting m-cresol, mixtures of m-cresol and p-cresol, or phenol with formaldehyde using conditions well known to those skilled in the art.

A solvent soluble novolak resin is one that is sufficiently soluble in a coating solvent to produce a coating solution that can be coated to produce a second (or outer) layer. In some cases, it may be desirable to use a novolak resin with the highest weight-average molecular weight that maintains its solubility in common coating solvents, such as acetone, tetrahydrofuran, and 1-methoxypropan-2-ol. Outer layers comprising novolak resins, including for example m-cresol only novolak resins (i.e. those that contain at least about 97 mol-% m-cresol) and m-cresol/p-cresol novolak resins that have up to 10 mol-% of p-cresol, having a weight average molecular weight of at least 10,000 and preferably at least 25,000, may be used. Second layers comprising m-cresol/p-cresol novolak resins with at least 10 mol-% of p-cresol, having a weight average molecular weight of about 8,000 up to about 25,000, may also be used. In some instances, novolak resins prepared by solvent condensation may be desirable. Outer layers comprising these resins are disclosed for example in U.S. Pat. No. 6,858,359 (Kitson, et al.), the disclosure of which is incorporated herein by reference.

Other useful poly(vinyl phenol) resins include polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers, measured as described above for the novolak resins, of the novolak resins is from about 1000 to about 200,000 g/mol, and more preferably from about 1,500 to about 50,000 g/mol.

Examples of useful hydroxy-containing polymers include ALNOVOL SPN452, SPN400, HPN100 (Clariant GmbH), DURITE PD443, SD423A, SD126A, PD494 (Borden Chemical, Inc.), BAKELITE 6866LB02, 6564LB, 6866LB03 (all Bakelite AG), KR 400/8, (Koyo Chemicals Inc.), HRJ 1085 and 2606 (Schenectady International, Inc.), and Lyncur CMM (Siber Hegner), all of which are described in U.S. Patent Application Publication 2005/0037280 (noted above). Particularly useful polymers are BAKELITE 6564LB, and Durite PD494 described for the Examples below. The Bakelite AG and Bordon Chemical products are now available from Hexion Specialty Chemicals (Columbus, Ohio).

The second layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprise recurring units derived from the noted monomers as well as recurring units derived from additional, but optional monomers [such as (meth)acrylates, (meth)acrylonitrile and (meth)acrylamides].

The polymers derived from maleic anhydride generally comprise from about 1 to about 50 mol % of recurring units derived from maleic anhydride and the remainder of the recurring units derived from the styrenic monomers and optionally additional polymerizable monomers.

The polymers formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art.

The second layer can also comprise one or more polymer binders having pendant epoxy groups sufficient to provide an epoxy equivalent weight of from about 130 to about 1000 (preferably from about 140 to about 750). "Epoxy equivalent weight" refers to the weight of the polymer (grams) divided by the number of equivalence of epoxy groups (number of moles) in the polymer. Any film-forming polymer containing the requisite pendant epoxy groups can be used including condensation polymers, acrylic resins, and urethane resins. The pendant epoxy groups can be part of the polymerizable monomers or reactive components used to make the polymers, or they can be added after polymerization using known procedures. The second layer can comprise one or more acrylic resins that are derived from one or more ethylenically unsaturated polymerizable monomers, at least one of which monomers comprises pendant epoxy groups such as those described in copending and commonly assigned U.S. Ser. No. 11/257,864 (filed Oct. 25, 2005 by Huang, Saraiya, Ray, Kitson, Sheriff, and Krebs), that is incorporated herein by reference.

Particularly useful polymers of this type have pendant epoxy groups attached to the polymer backbone through a carboxylic acid ester group such as a substituted or unsubstituted —C(O)O-alkylene, —C(O)O-alkylene-phenylene-, or —C(O)O-phenylene group wherein alkylene has 1 to 4 carbon atoms. Preferred ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate.

The epoxy-containing polymers can also comprise recurring units derived from one or more ethylenically unsaturated polymerizable monomers that do not have pendant epoxy groups including but not limited to, (meth)acrylates, (meth)acrylamides, vinyl ether, vinyl esters, vinyl ketones, olefins, unsaturated imides (such as maleimide), N-vinyl pyrrolidones, N-vinyl carbazole, vinyl pyridines, (meth) acrylonitriles, and styrenic monomers. Of these, the (meth) acrylates, (meth)acrylamides, and styrenic monomers are preferred and the styrenic monomers are most preferred. For example, a styrenic monomer could be used in combination with methacrylamide, acrylonitrile, maleimide, vinyl acetate, or N-vinyl pyrrolidone.

Preferably, the second layer is free of compounds that act as hardeners for the pendant epoxy groups but in some embodiments, conventional hardeners can be present.

The one or more polymer binders are present in the second layer in an amount of at least 60 weight %, and preferably from about 65 to about 99.5 weight %.

The second layer optionally comprises a dissolution inhibitor that functions as a solubility-suppressing component for the second polymeric binder. Dissolution inhibitors generally have polar functional groups that are thought to act as acceptor sites for hydrogen bonding, such as with hydroxyl groups of the binder. Dissolution inhibitors that are soluble in the developer are most suitable. Alternatively, or additionally, the second polymeric binder may contain solubility-suppressing polar groups that function as the dissolution inhibitor.

Useful dissolution inhibitor compounds are described for example in U.S. Pat. No. 5,705,308 (West et al.), U.S. Pat. No. 6,060,222 (West et al.), and U.S. Pat. No. 6,130,026 (Bennett et al.), all of which are incorporated herein by reference.

Compounds that contain a positively charged (i.e., quaternized) nitrogen atom are useful as dissolution inhibitors. Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenylamine and triphenylamine.

Keto-containing compounds useful as dissolution inhibitor compounds include, for example, aldehydes, ketones, especially aromatic ketones, and carboxylic acid esters. Other readily available dissolution inhibitors are triarylmethane dyes, such as ethyl violet, crystal violet, malachite green, brilliant green, Victoria blue B, Victoria blue R, Victoria blue BO, BASONYL Violet 610. These compounds can also act as contrast dyes that distinguish the unimaged regions from the imaged regions in the developed imageable element.

When a dissolution inhibitor compound is present in the second layer, it typically comprises at least about 0.1 weight %, more generally from about 0.5 to about 30 weight %, and preferably from about 1 to about 15 weight %, based on the dry weight of the outer layer.

Alternatively, or additionally, the second polymeric binder in the second layer can comprise polar groups that act as acceptor sites for hydrogen bonding with the hydroxy groups present in the polymeric material and, thus, act as both the binder and dissolution inhibitor. These derivatized polymeric materials can be used alone in the second layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically from about 0.5 mol % to about 5 mol %, and preferably from about 1 mol % to about 3 mol %, of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West et al.). An example of a resin derivatized with a compound that comprises a diazonaphthoquinone moiety is P-3000 (available from PCAS, France), and is a naphthoquinone diazide of a pyrogallol/acetone resin.

The second layer can also include other components such as surfactants, dispersing aids, humectants, biocides, viscosity builders, drying agents, antifoaming agents, preservatives, antioxidants, colorants, and contrast dyes. Coating surfactants are particularly useful.

The second layer generally has a dry coating coverage of from about 0.2 to about 2 $g/m^2$ and preferably from about 0.2 to about 0.75 $g/m^2$.

Although not preferred, there may be a separate layer that is disposed between the first and second layers. This interlayer generally comprises a polymeric material that is soluble in an alkaline developer. A preferred polymeric material of this type is a poly(vinyl alcohol). Generally, the interlayer should be less than one-fifth as thick as the first layer and preferably less than one-tenth as thick as the second layer.

Preparation of the Imageable Element

The imageable element can be prepared by sequentially applying a first layer formulation over the surface of the substrate (and any other hydrophilic layers provided thereon), and then applying a second layer formulation over the first layer using conventional coating or lamination methods. It is desirable to avoid intermixing the inner and outer layer formulations.

The first and second layers can be applied by dispersing or dissolving the desired ingredients in suitable coating solvents, and the resulting formulations are sequentially or simultaneously applied to the substrate using any suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the first and second layers depends upon the nature of the polymeric materials and other components in the formulations. To prevent the first and second layer formulations from mixing or the first layer dissolving when the second layer formulation is applied, the second layer should be coated from a solvent in which the polymeric material(s) of the first layer are insoluble. Generally, the first layer formulation is coated out of a solvent mixture of methyl ethyl ketone (MEK), 1-methoxypropan-2-ol (Dowanol PM or PGME), γ-butyrolactone, and water, a mixture of diethyl ketone (DEK), water, methyl lactate, and γ-butyrolactone, or a mixture of methyl lactate, methanol, and dioxolane. The second layer formulation is generally coated out of DEK, PGME, a mixture of DEK and 1-methoxy-2-propyl acetate, a mixture of 1,3-dioxolane, PGME, γ-butyrolactone, and water, or a mixture of MEK and Dowanol PM.

Alternatively, the first and second layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

After the first and second layers are dried on the substrate (that is, the coatings are self-supporting and dry to the touch), the element is heat treated at from about 40 to about 90° C. (preferably at from about 50 to about 70° C.) for at least 4 hours and preferably at least 20 hours, and more preferably for at least 24 hours. The maximum heat treatment time can be as high as 96 hours, but the optimal time and temperature for the heat treatment can be readily determined by routine experimentation. This heat treatment can also be known as a "conditioning" step.

It is also desirable that during the heat treatment, the imageable element is wrapped or encased in a water-impermeable sheet material to represent an effective barrier to moisture removal from the precursor. Preferably, this sheet material is sufficiently flexible to conform closely to the shape of the imageable element (or stack thereof) and is generally in close contact with the imageable element (or stack thereof). More preferably, the water-impermeable sheet material is sealed around the edges of the imageable element or stack thereof. Preferred water-impermeable sheet materials are polymeric films or metal foils that are sealed around the edges of imageable element or stack thereof.

Alternatively, the heat treatment (or conditioning) of the imageable element (or stack thereof) is carried out in an environment in which relative humidity is controlled to at least 25%, preferably to at least 30%, and more preferably to at least 35%. Relative humidity is defined as the amount of water vapor present in air expressed as a percentage of the amount of water required for saturation at a given temperature.

Preferably, a stack containing at least 100 of the imageable elements are heat treated at the same time. More commonly, such a stack includes at least 500 imageable elements.

In may be difficult to achieve good wrapping at the top and bottom of such a stack using the water-impermeable sheet material and in such instances, it may be desirable to use "dummy" or reject elements in those regions of the stack. Thus, the heat treated (or "conditioned") stack may include at least 100 useful imageable elements in combination with dummy or reject elements. These dummy or reject elements also serve to protect the useful elements from damage caused by the wrapping or sealing process.

Alternatively, the imageable element(s) may be heat treated in the form of a coil and then cut into individual elements at a later time. Such coils can include at least 1000 $m^2$ of imageable surface and more typically at least 3000 $m^2$ of imageable surface.

Adjacent coils or "spirals" or a coil, or strata of a stack may, if desired, be separated by interleaving materials, for example, papers or tissues that may be sized with plastics or resins (such as polythene).

Representative methods for preparing imageable elements according to this invention are shown in the Examples below.

The imageable elements have any useful form including, but not limited to, printing plate precursors, printing cylinders, printing sleeves and printing tapes (including flexible printing webs). Preferably, the imageable members are printing plate precursors to provide lithographic printing plates.

Printing plate precursors can be of any useful size and shape (for example, square or rectangular) having the requisite first and second layers disposed on a suitable substrate. Printing cylinders and sleeves are known as rotary printing members having the substrate and first and second layers in a cylindrical form. Hollow or solid metal cores can be used as substrates for printing sleeves.

Imaging and Development

During use, the imageable element is exposed to a suitable source of imaging radiation (such as infrared radiation) using a laser at a wavelength of from about 600 to about 1200 nm and preferably from about 700 to about 1200 nm. The lasers used to expose the imaging element are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus is available as models of Creo Trendsetters® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Gerber Crescent 42T Platesetter that operates at a wavelength of 1064 nm and the Screen PlateRite 4300 series or 8600 series platesetters (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/$cm^2$, and more particularly from about 75 to about 400 mJ/$cm^2$.

While laser imaging is preferred, imaging can be provided by any other means that provides thermal energy in an imagewise fashion. For example, imaging can be accomplished using a thermoresistive head (thermal printing head) in what is known as "thermal printing" as described for example in U.S. Pat. No. 5,488,025 (Martin et al.) and as used in thermal fax machines and sublimation printers. Thermal print heads are commercially available (for example, as Fujitsu Thermal Head FTP-040 MCS001 and TDK Thermal Head F415 HH7-1089).

In any case, direct digital imaging is generally used for imaging. The image signals are stored as a bitmap data file on a computer. The bitmap data files are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outer layer and the layers (including the inner layer) underneath it, and exposing the hydrophilic surface of the substrate. Thus, the imageable element is "positive-working". The exposed (or imaged) regions of the hydrophilic surface repel ink while the unexposed (or non-imaged) regions of the outer layer accept ink.

More particularly, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible".

The imaged elements are generally developed using conventional processing conditions. Both aqueous alkaline developers and solvent-based alkaline developers (which are preferred) can be used.

Aqueous alkaline developers generally have a pH of at least 7 and preferably of at least 11. Useful alkaline aqueous developers include 3000 Developer, 9000 Developer, GoldStar™ Developer, GreenStar Developer, ThermalPro Developer, Protherm® Developer, PD-1 Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. It is particularly desirable that the alkaline developer contain one or more thiosulfate salts or amino compounds that include an alkyl group that is substituted with a hydrophilic group such as a hydroxy group, polyethylene oxide chain, or an acidic group having a pKa less than 7 (more preferably less than 5) or their corresponding salts (such as carboxy, sulfo, sulfonate, sulfate, phosphonic acid, and phosphate groups). Particularly useful amino compounds of this type include, but are not limited to, monoethanolamine, diethanolamine, glycine, alanine, aminoethylsulfonic acid and its salts, aminopropylsulfonic acid and its salts, and Jeffamine compounds (for example, an amino-terminated polyethylene oxide).

Representative solvent-based alkaline developers include ND-I Developer, 955 Developer and 956 Developer (available from Kodak Polychrome Graphics, a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the second layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

Materials and Methods Used in the Examples:

EUV-5 is a polymer having the following structure that was prepared using conventional starting materials and polymerization conditions:

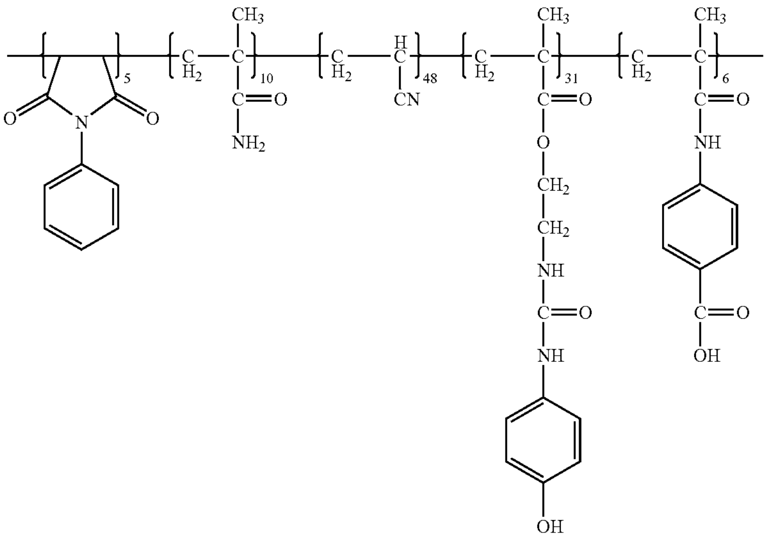

D11 dye was obtained from PCAS (Longjumeau, France) and is represented by the following structure:

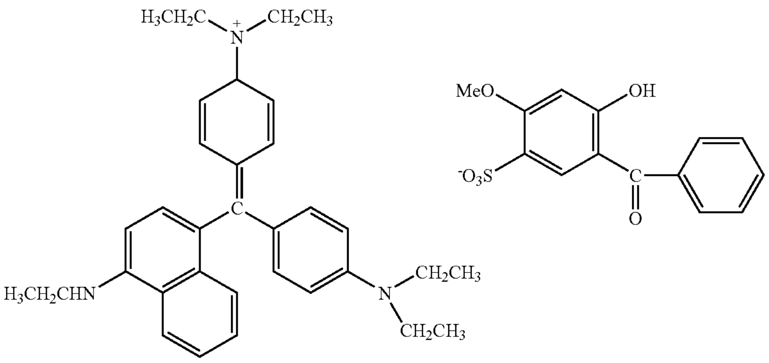

PS210CNE is an IR dye that was obtained from Nippon Kayaku, (Tokyo, Japan).

Pyromellitic anhydride was obtained from Sigma Aldrich Chemicals (Milwaukee, Wis.).

DURITE PD494 and BAKELITE LB6564 are novolak resins that were obtained from Hexion Specialty Chemicals (Columbus, Ohio).

KF654b is an IR dye with the following structure and was obtained from the Reidel de Hahn part of the Sigma Aldrich group:

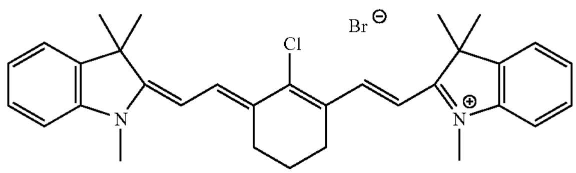

Byk® 307 is a polyethoxylated dimethylpolysiloxane copolymer that is available from BYK Chemie (Wallingford, Conn.).

Developer PD1 is an alkaline developer available from Kodak Polychrome Graphics, Japan, (Gunma, Japan), a subsidiary of Eastman Kodak Company.

GoldStar™ Premium Developer is an alkaline developer available from Kodak Polychrome Graphics (Hartford, Conn.), a subsidiary of Eastman Kodak Company.

MEK is methyl ethyl ketone.

BLO is γ-butyrolactone.

PGME is propylene glycol methyl ether.

EXAMPLE 1

Inner layer ("first" layer) coating formulations 1–3 were prepared with the coating compositions shown in TABLE I (all values in wt. %) in a solvent mixture of 65 parts of MEK, 15 parts of PGME, 10 parts of water, and 10 parts of BLO:

TABLE I

| Inner Layer | EUV-5 | D11 Dye | PS210CNE | KF654b | Pyromellitic anhydride |
|---|---|---|---|---|---|
| 1 | 91.5% | 3% | 2% | 0% | 3.5% |
| 2 | 88.5% | 3% | 5% | 0% | 3.5% |
| 3 | 92% | 3% | 2.75% | 0.75% | 2% |

Outer layer ("second" layer) coating formulations were prepared with the compositions shown in TABLE II (all values in wt. %) in PGME:

TABLE II

| Outer Layer | LB6564 | PD494 | PS210CNE | KF654b |
|---|---|---|---|---|
| 1 | 84.6% | 11.4% | 2% | 2% |
| 2 | 75% | 25% | 0% | 0% |

Both inner and outer layer formulations included 0.6 wt. % of Byk® 307 surfactant.

Two substrates were used to prepare the imageable elements, as shown in the following TABLE III:

TABLE III

| Substrate | Grain Ra | Rv | $D_{min}$ | Post treatment |
|---|---|---|---|---|
| A | 0.45–0.59 μm | 2.0 μm | 0.36 | PVPA |
| B | 0.35–0.48 μm | ~4.0 μm | 0.33 | PVPA |

$D_{min}$ is the optical density of the uncoated substrate measured by an X-rite 500 series densitometer.
PVPA is poly(vinyl phosphonic acid).

Both layer formulations were coated using a laboratory hopper coater on Substrate A as shown in the following TABLE IV. The dry coated layer weights were 0.8 g/m$^2$ for the inner layer and 0.3 g/m$^2$ for the outer layer. Both coatings were dried initially at 71° C. for 45 seconds and afterwards at 130° C. for 30 seconds.

After drying, the resulting imageable elements were heat treated in an oven at 55° C./25% RH for 3 days.

TABLE IV

| | Inner Layer | | |
|---|---|---|---|
| Outer Layer | 1 | 2 | 3 |
| 1 | A | B | |
| 2 | | | Reference |

Test Methods:

Cleanout: The cleanout of the coatings was evaluated by imaging the elements on a Screen PTR4300 platesetter followed by development with lithographic Developer PD1 (diluted 1 part developer to 8 parts water) held at 30° C. in a PK processor. The energy required to achieve cleanout, that is, complete removal of imaged coating, is expressed in the % of maximum power with the platesetter set at the maximum drum speed (1000 rpm).

Resolution: The ratings shown in the following TABLE V were used to evaluate resolution:

TABLE V

| Rating | Highlight Dots | Shadow Cleanout |
|---|---|---|
| 4 | 1 × 1 pixel retained | 1 × 1 pixel cleaned out |
| 3 | 1 × 2 pixel retained | 1 × 2 pixel cleaned out |
| 2 | 2 × 2 pixel retained | 2 × 2 pixel cleaned out |
| 1 | 3 × 3 pixel retained | 3 × 3 pixel cleaned out |

For all plates, 2400 dpi images were used.

The imageable elements were tested after the following treatments:

Prior to conditioning

After conditioning

After an artificial ageing regimen at 40° C./80% RH for 3 days (both conditioned and non-conditioned plates).

The results are shown in the following TABLES VI and VII:

TABLE VI

| | Cleanout | | | |
|---|---|---|---|---|
| Element | Non-conditioned | Cleanout after Aging | Conditioned | Cleanout after Aging |
| A | <35% | 65% | 50% | 55% |
| B | <35% | 40% | 40% | 40% |
| Reference | <35% | No clean out | No clean out | No clean out |

TABLE VII

| | Resolution rating | |
|---|---|---|
| Element | Conditioned Highlight/shadow | After Aging Highlight/shadow |
| A | 2/4 | 2/3 |
| B | 2/4 | 2/4 |
| Reference | — | — |

All resolution figures were measured at 55% exposure.

It is desirable to achieve a low clean out while maintaining good resolution, that is, a balance of retaining highlight features and cleaning the shadows. The Reference element exhibited poor aging without conditioning, that is, the cleanout increased from less than 35% to greater than 70% during aging. After conditioning, the Reference element exhibited poor cleanout even with no aging. The elements obtained by the present invention exhibited an increase in cleanout power once aged if no conditioning was undertaken. However, once conditioned, they exhibited good, stable cleanout. The resolution of those elements was also acceptable.

EXAMPLE 2

Slightly adjusted formulations were coated on alternative Substrate B as described in Example 1.

For Element C, the inner layer composition was the same as described in Example 1 (Formulation 1). The upper layer formulation was prepared from 73.4% of LB6564, 22.6% of PD494, 2% of KF654b, and 2% of PS210CNE (all amounts by weight).

For Element D, the inner layer composition was the same as described in Example 1 (Formulation 2). The outer layer formulation was the same as for Element C.

The following results, obtained after conditioning, are shown in TABLE VIII. These results show that the elements having Substrate B exhibited acceptable levels of cleanout after conditioning, and in the case of Element C improved resolution, unlike the Reference element.

TABLE VIII

| Element | Clean out | Resolution |
|---|---|---|
| C | 45% | ¾ |
| D | 40% | ⅔ |

EXAMPLE 3

Element E was prepared as described in Example 1 using the following inner and outer layer formulations (all amounts by weight):

Inner layer formulation contained 93% of EUV-5, 3% of D11, 2% of pyromellitic anhydride, and 2% of PS210CNE.

Outer layer formulation contained 64% of LB6564, 32% of PD494, 2% PS210CNE, and 2% of KF654b.

The element was processed in a Mercury of the Americas processor (available from Kodak Polychrome Graphics) that was charged with GoldStar™ Premium developer that was held at a temperature of 23° C. for a processing time of 41 seconds. All other testing conditions were the same as described in Example 1. The results are shown below in TABLES IX (Clean out) and X (Resolution). These results show that the non-conditioned element exhibited an increase in cleanout power with aging (cleanout increased from 35% to 60%). This is an unacceptable change with aging. The elements conditioned according to this invention exhibited good, stable cleanout (50% after conditioning and 50% after conditioning and aging) without compromising resolution.

TABLE IX

| Non-conditioned | After Aging | After Conditioning | After Conditioning & Aging |
|---|---|---|---|
| 35% | 60% | 50% | 50% |

TABLE X

| Non-conditioned | After aging | After Conditioning | After conditioning & Aging |
|---|---|---|---|
| 2/4 | 2/3 | 2/4 | 2/4 |

The invention has been described in detail with particular reference to certain preferred embodiments thereof, but it will be understood that variations and modifications can be effected within the spirit and scope of the invention.

The invention claimed is:

1. A method of providing a positive working imageable element comprising:

A) providing a first layer onto a substrate, said first layer comprising a first radiation absorbing compound dispersed within a first polymeric binder, B) providing a second layer on said first layer, said second layer comprising a second radiation absorbing compound dispersed within a second polymeric binder, and C) after drying said first and second layers, heat treating said first and second layers at from about 40 to about 90° C. for at least 4 hours under conditions that inhibit the removal of moisture from said dried first and second layers.

2. The method of claim 1 wherein said heat treatment is carried out for at least 20 hours.

3. The method of claim 1 wherein said heat treatment is carried out at from about 50 to about 70° C. for at least 24 hours.

4. The method of claim 1 wherein during said heat treatment, said imageable element is wrapped or encased in a water-impermeable sheet material to represent an effective barrier to moisture removal from the precursor, or said heat treatment of the imageable element is carried out in an environment in which relative humidity is controlled to at least 25%.

5. The method of claim 4 wherein during said heat treatment, said water-impermeable sheet material is sealed around the edges of said imageable element.

6. The method of claim 5 wherein said water-impermeable sheet material is a polymeric film or metal foil that is sealed around the edges of said imageable element.

7. The method of claim 1 wherein said imageable element is heat treated in a stack comprising at least 100 of the same imageable elements.

8. The method of claim 1 wherein said imageable element is heat treated in the form of a coil.

9. The method of claim 1 wherein said second polymeric binder is a polymer having hydroxyl groups.

10. The method of claim 9 wherein said second polymeric binder is a phenolic resin or a poly(hydroxystyrene) resin.

11. The method of claim 1 wherein said first and second radiation absorbing compounds are the same compound.

12. The method of claim 1 wherein said first radiation absorbing compound is present in an amount of from about 0.5 to about 10 weight % and said second radiation absorbing compound is present in an amount of from about 0.5 to about 10 weight %.

13. The method of claim 1 wherein said first polymeric binder comprises recurring units derived from one or more (meth)acrylamides, (meth)acrylonitriles, N-substituted cyclic imides, styrenic derivatives, and monomers having a pendant group containing a urea group.

14. The method of claim 13 wherein said first polymeric binder comprises recurring units derived from one or more (meth)acrylamides, (meth)acrylonitriles, N-substituted cyclic imides, monomers represented by the following Structure (I) or (II):

$$CH_2{=}CH(R^1){-}C(O){-}X{-}(Y)_m{-}R^2 \quad (I)$$

$$CH_2{=}CH(R^1){-}Ar{-}[(Y)_m{-}R^2]_p \quad (II)$$

wherein $R^1$ is hydrogen, a lower alkyl group, or a halo group, X is oxy or —NR'—, R' is hydrogen or an alkyl group, Ar is an arylene group, Y is an alkylene group, $R^2$ is a —NHC(O)NH-phenyl group or a phenyl group, m is 0 or 1, p is 1 to 5, provided that m is 1 when $R^2$ is a —NHC(O)NH-phenyl group in Structure (I).

15. The method of claim 14 wherein $R^1$ is hydrogen or methyl, R' is hydrogen or methyl, Ar is phenylene, Y is a linear or branched alkylene having 1 to 4 carbon atoms, m is 1, p is 1, and $R^2$ is a —NHC(O)NH-phenyl group wherein the phenyl moiety is optionally substituted with one or more hydroxy, carboxy, or —$S(O)_2NH_2$ groups.

16. The method of claim 14 wherein said first polymeric binder is represented by the following Structure (III):

$$-(A)_w-(B)_x-(C)_y-(D)_z- \quad (III)$$

wherein A represents recurring units derived from one or more (meth)acrylamides, B represents recurring units derived from one or more (meth)acrylonitriles, C represents recurring units derived from one or more N-substituted maleimides, D represents recurring units derived from one or more monomers represented by Structure (I) or (II), w is from about 1 to about 30 wt. %, x is from about 20 to about 75 wt. %, y is from about 1 to about 30 wt. %, and z is from about 20 to about 75 wt. %.

17. The method of claim 14 wherein D represents recurring units derived from first and second D monomers wherein:

(a) said first "D" monomer is defined by Structure (I) wherein $R^1$ is hydrogen or a methyl group, X is oxy, Y is a —$CH_2CH_2$— group, m is 1, and $R^2$ is a —NHC(O)NH-phenyl, —NHC(O)NH—$C_6H_4$—OH, or —NHC(O)NH—$C_6H_4$—COOH group, and said second "D" monomer is defined by Structure (I) wherein $R^1$ is hydrogen or a methyl group, X is —NH—, m is 0, and $R^2$ is a phenyl, hydroxyphenyl, or carboxyphenyl group, or (b) said first "D" monomer is defined by Structure (II) wherein $R^1$ is hydrogen or a methyl group, Y is a —$C(CH_3)_2$— group, m is 1, p is 1, and $R^2$ is a —NHC(O)NH-phenyl, —NHC(O)NH—$C_6H_4$—OH, or —NHC(O)NH—$C_6H_4$—COOH group, and said second "D" monomer is defined by Structure (I) wherein $R^1$ is hydrogen or a methyl group, X is —NH—, m is 0, and $R^2$ is a phenyl, hydroxyphenyl, or carboxyphenyl group.

18. The method of claim 1 further comprising

D) imagewise exposing the imageable element provided by claim 1 to provide imaged and non-imaged regions, and E) contacting the imagewise exposed imageable element with an aqueous developer to remove said imaged regions only.

19. The method of claim 18 wherein said imagewise exposed imageable element is a lithographic printing plate.

20. The method of claim 18 wherein said imagewise exposure is carried out at a wavelength of from about 700 to about 1200 nm.

21. An imaged element obtained by the method of claim 18.

22. A method of producing an imaged article, comprising:

A) providing a positive-working imageable element by the method of claim 1,

B) imagewise exposing said imageable element to provide imaged and non-imaged regions, and C) contacting the imagewise exposed imageable element with an aqueous developer to remove the imaged regions only.

23. The method of claim 22 wherein said imagewise exposed imageable element is baked after step B.

* * * * *